US008462088B2

(12) United States Patent
Lee

(10) Patent No.: US 8,462,088 B2
(45) Date of Patent: Jun. 11, 2013

(54) ORGANIC LIGHT EMITTING DISPLAY DEVICE

(75) Inventor: Jae Hyuk Lee, Yeungnam Neoville (KR)

(73) Assignee: LG Display Co., Ltd., Seoul (KR)

( * ) Notice: Subject to any disclaimer, the term of this patent is extended or adjusted under 35 U.S.C. 154(b) by 1592 days.

(21) Appl. No.: 11/642,850

(22) Filed: Dec. 21, 2006

(65) Prior Publication Data

US 2007/0146255 A1     Jun. 28, 2007

(30) Foreign Application Priority Data

Dec. 26, 2005     (KR) .................. 10-2005-0129672

(51) Int. Cl.
*G02F 1/1333* (2006.01)
(52) U.S. Cl.
USPC ............... 345/82; 345/55; 345/204; 345/205; 345/206; 345/76; 315/169.3; 313/463
(58) Field of Classification Search
USPC .............. 345/82–83, 76–78, 173, 174, 1.1, 345/176, 178, 104, 55, 204–206; 315/169.3; 349/12, 122, 137, 158; 313/463
See application file for complete search history.

(56) References Cited

U.S. PATENT DOCUMENTS

| 6,329,044 | B1 * | 12/2001 | Inoue et al. .................... 428/209 |
| 6,572,941 | B1 * | 6/2003 | Murakami et al. .............. 428/34 |
| 6,590,622 | B1 * | 7/2003 | Nakanishi et al. ............. 349/12 |
| 7,143,504 | B2 * | 12/2006 | Tanaka ......................... 29/602.1 |
| 7,508,461 | B2 * | 3/2009 | Jeong et al. ..................... 349/12 |
| 2001/0020985 | A1 * | 9/2001 | Hinata ............................ 349/12 |
| 2004/0095060 | A1 * | 5/2004 | Ushifusa et al. .............. 313/495 |
| 2005/0253773 | A1 * | 11/2005 | Sekiguchi ....................... 345/1.1 |

FOREIGN PATENT DOCUMENTS

| JP | 2-281593 A | 11/1990 |
| JP | 2004071246 A | 3/2004 |
| JP | 2004-151370 A | 5/2004 |

OTHER PUBLICATIONS

Japanese Office Action (Application No. 2006-347518), Aug. 21, 2012.
Japanese Office Action dated May 31, 2011.

* cited by examiner

*Primary Examiner* — Lun-Yi Lao
*Assistant Examiner* — Olga Merkoulova
(74) *Attorney, Agent, or Firm* — Morgan, Lewis & Bockius LLP

(57) ABSTRACT

An organic light emitting display device comprises a first substrate and a second substrate, a display unit formed on the first substrate, and a film disposed between the first substrate and the second substrate and comprising an opening in a region corresponding to the display unit.

15 Claims, 9 Drawing Sheets

ORGANIC LIGHT EMITTING DISPLAY DEVICE

CROSS-REFERENCE

This application claims priority to and the benefit of Korean Patent Application No. 10-2005-0129672, filed on Dec. 26, 2005, the entire contents of which is incorporated herein by reference.

BACKGROUND

1. Field

The present invention relates to an organic light emitting display device.

2. Related Art

Among various flat panel display devices, a light emitting display device is generally advantageous of a fast response rate and low power consumption. Since a light emitting display device does not need a backlight, it can be manufactured lightweight.

In particular, an organic light emitting display device comprises an organic emission layer formed between an anode and a cathode. Thus, holes supplied from an anode and electrons supplied from a cathode are connected together within the organic emission layer to produce excitons, which are electron-hole pairs. When these excitons transit to a ground state, a certain level of energy is produced, and this energy causes the organic light emitting display device to emit light.

FIG. 1A illustrates a plan view of a first substrate of a conventional organic light emitting display device. FIG. 1B illustrates a perspective view of the conventional organic light emitting display device. FIG. 1C illustrates a sectional view of the conventional organic light emitting display device taken along a line I-I' illustrated in FIG. 1B.

Referring to FIGS. 1A to 1C, in the conventional light emitting display device 100, a display unit A is disposed on the first substrate 110. The display unit A includes anodes 120 arranged in a stripe pattern, and cathodes 130 disposed to intersect individually with the anodes 120. Although not shown, an emission layer is formed in every space between the anode 120 and the cathode 130.

A driver 140 is disposed on one side of the first substrate 110 to supply an electrical signal to the anodes 120 and the cathodes 130. The driver 140 supplies an electrical signal to the anodes 120 and the cathodes 130 through scan lines 117A and 117B and data lines 118.

A sealant 170 is coated on a region of the first substrate 110 in an outer region of the display unit A. The sealant 170 seals the first substrate 110, in which the display unit A is formed, with a second substrate 160, which is an encapsulation substrate. A moisture absorbent 165 may be disposed on an inner region of the second substrate 160.

The conventional organic light emitting display device often has a limitation in that a processing time is elongated due to complexity in those processes of forming the driver 140 and various lines 117A, 117B and 118 on the first substrate 110.

Also, when a shock is exerted from the outside, the moisture absorbent 165, disposed on the second substrate 160, and the display unit A, disposed on the first substrate 110, make contact with each other, resulting in generation of a dark spot or a line failure on the display unit A. The dark spot and the line failure may degrade the image quality of the organic light emitting display device.

SUMMARY

Accordingly, embodiments of the present invention are directed to provide an organic light emitting display device suitable for reducing a contact between a display unit and a moisture absorbent and simplifying a manufacturing process.

According to one embodiment of the present invention, an organic light emitting display device comprises a first substrate and a second substrate, a display unit formed on the first substrate, and a film disposed between the first substrate and the second substrate and comprising an opening in a region corresponding to the display unit.

According to another embodiment of the present invention, an organic light emitting display device comprises a first substrate and a second substrate, a first display unit and a second display unit formed on the first substrate and the second substrate, respectively, and a film disposed between the first substrate and the second substrate and comprising an opening disposed in a region corresponding to the first and second display units.

DETAILED DESCRIPTION

Figure 1A:
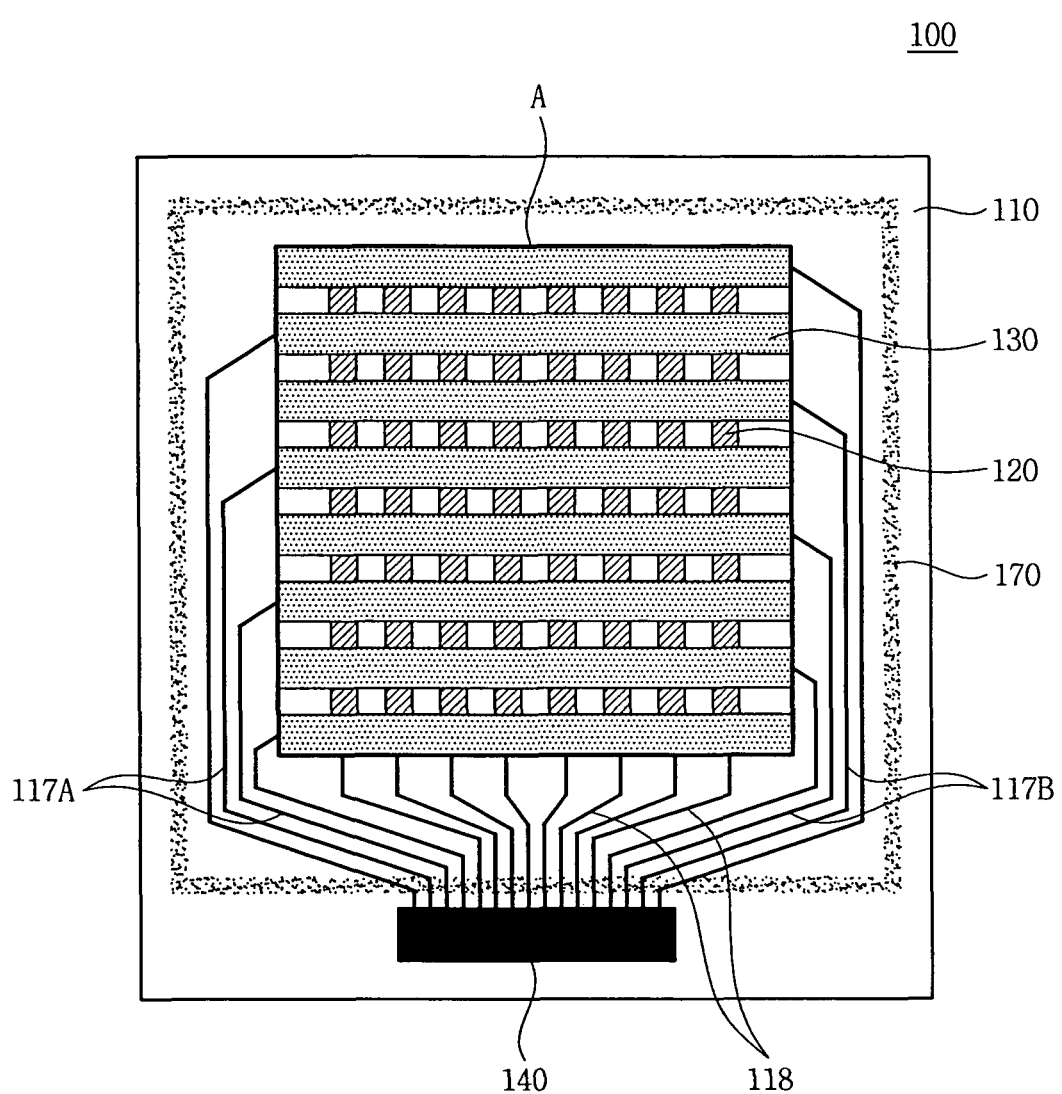
FIG. 1A illustrates a plan view of a first substrate of a conventional organic light emitting display apparatus.
Figure 1B:
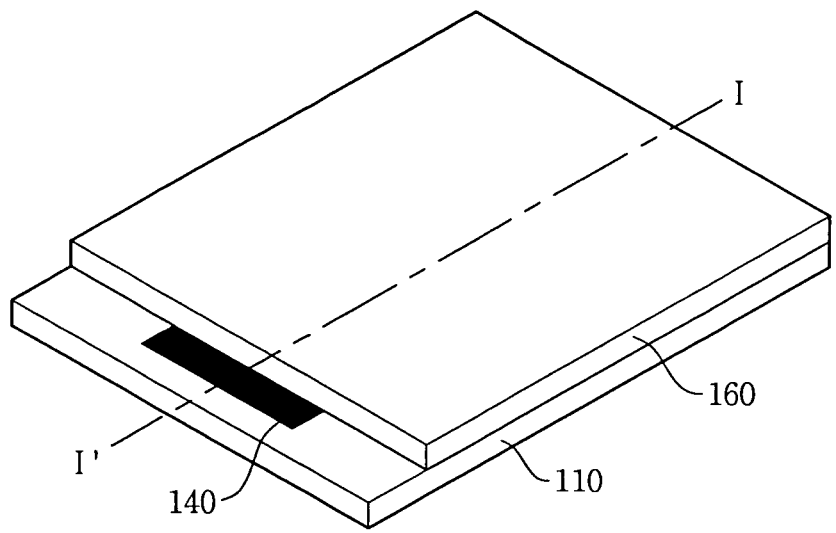
FIG. 1B illustrates a perspective view of the conventional organic light emitting display apparatus.
Figure 1C:
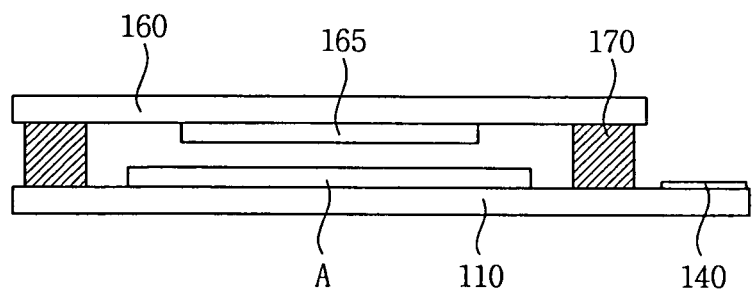
FIG. 1C illustrates a sectional view of the conventional organic light emitting display device taken along a line I-I' illustrated in FIG. 13.

An embodiment will be described with reference to the accompanying drawings. However, the present invention is not limited to one embodiment described below, but may be embodied in a variety of forms. In the drawings, if it is mentioned that a layer is positioned on a different layer or a substrate, the layer may be formed directly on the different layer or the substrate, or another layer may be interposed therebetween. Like reference numerals designate like elements.

<First Embodiment>

Figure 2A:
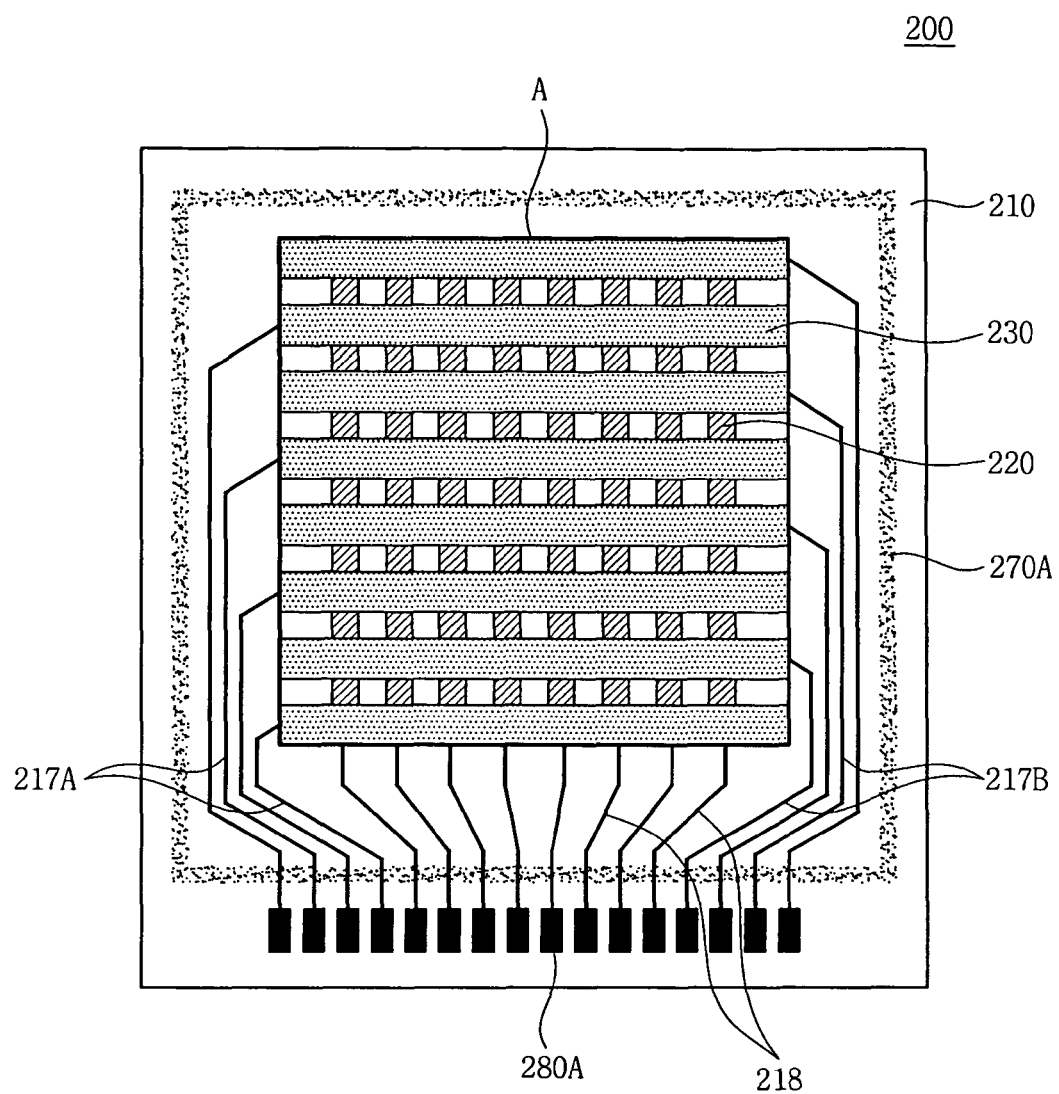
FIG. 2A illustrates a plan view of a first substrate of an organic light emitting display device according to a first embodiment of the present invention.
Figure 2B:
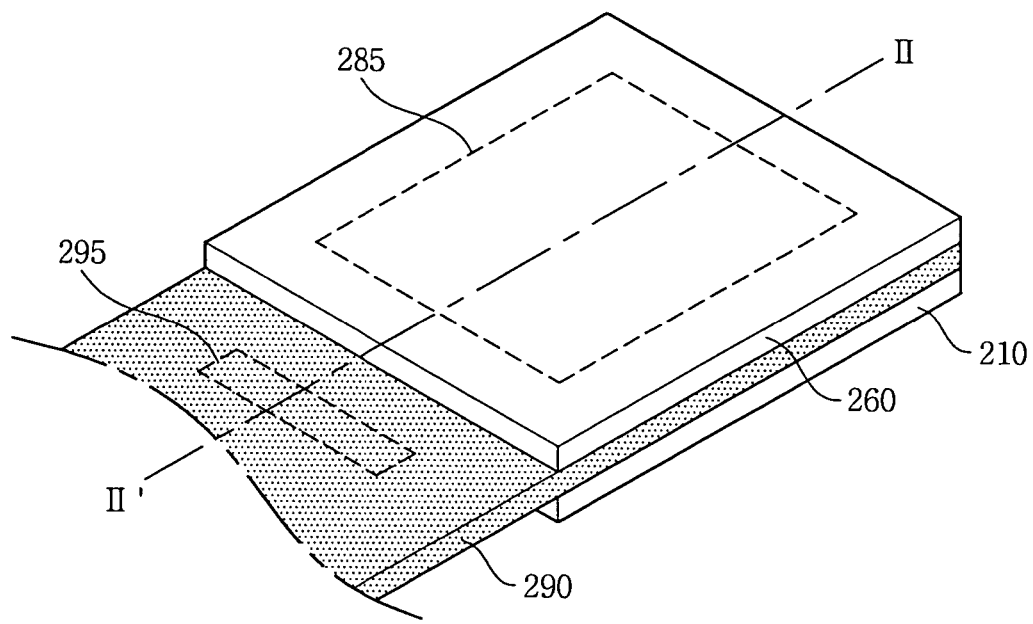
FIG. 2B illustrates a perspective view of the organic light emitting display device according to the first embodiment of the present invention.
Figure 2C:
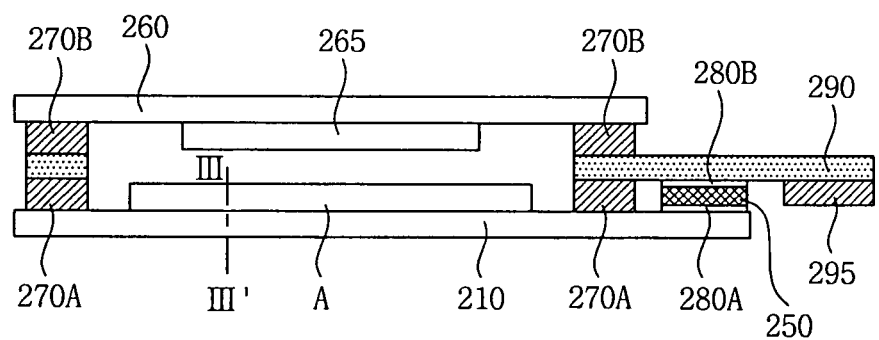
FIG. 2C illustrates a sectional view of the organic light emitting display device taken along a line II-II' illustrated in FIG. 2B.

FIG. 2A illustrates a plan view of a first substrate of an organic light emitting display device according to first embodiment of the present invention. FIG. 2B illustrates a perspective view of the organic light emitting display device according to the first embodiment of the present invention. FIG. 2C illustrates a sectional view of the organic light emitting display device taken along a line II-II' illustrated in FIG. 2B.

With reference to FIGS. 2A to 2C, in the organic light emitting display device 200, a display unit A is disposed on the first substrate 210. The display unit A comprises anodes 220 arranged in a stripe pattern, and cathodes 230 formed to intersect individually with the anodes 220. Although not illustrated, an emission layer is disposed in every space between the anode 220 and the cathode 230.

Figure 2D:
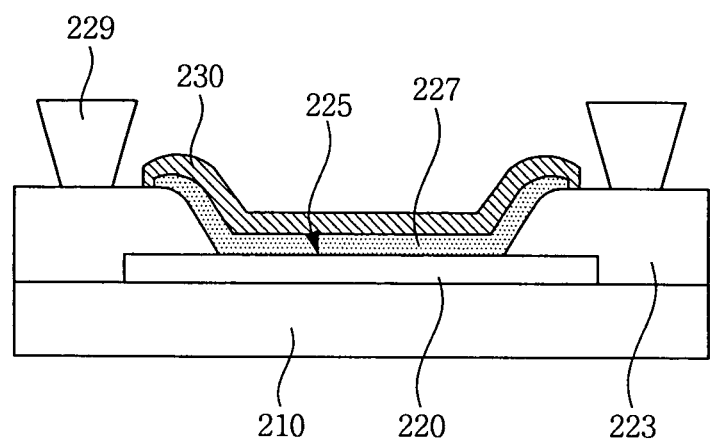
FIGS. 2D and 2E illustrate sectional views of the organic light emitting display device taken along a line III-III' illustrated in FIG. 2C.
Figure 2E:
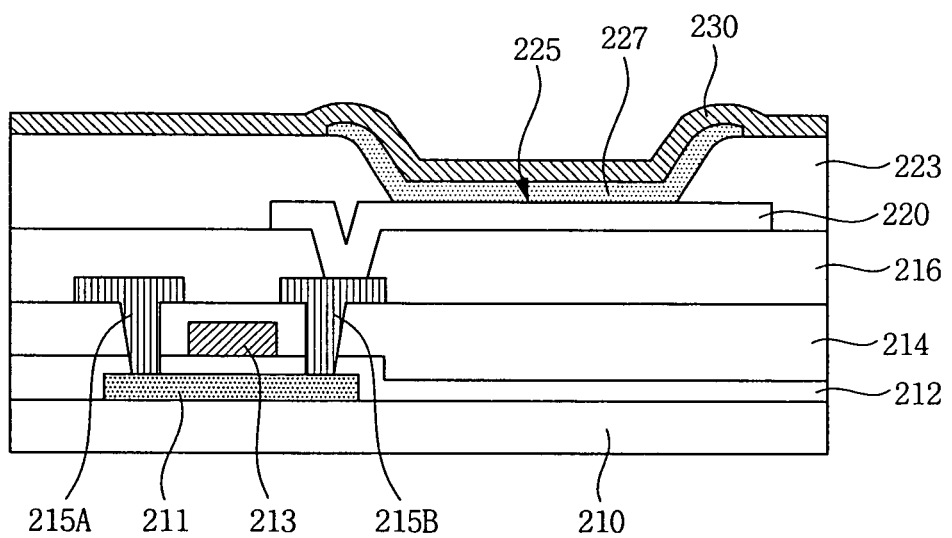

Referring to FIGS. 2D and 2E, a structure of the display unit A will be described in detail. As illustrated in FIG. 2D, the anode 220 is disposed on the first substrate 210. The anode 220 includes a transparent conductive material such as indium-tin-oxide (ITO) or indium-zinc-oxide (IZO).

An insulation layer 223 is disposed on the anode 220. The insulation layer 223 may comprise an opening 225 exposing a portion of the anode 220. Barrier ribs 229 may be disposed on those regions of the insulation layer 223 except for the region where the opening 225 is formed. The barrier ribs 229 are shaped to be inversely tapered.

An emission layer 227 is disposed inside the opening 225. Although not illustrated in FIG. 2D, inside the opening 225, a hole injection layer and/or a hole transport layer may be disposed between the anode 220 and the emission layer 227, and on the emission layer 227, an electron transport layer and/or an electron injection layer may be formed.

The cathode 230 is disposed on the emission layer 227. The cathode 230 may include a low work function metal such as aluminum or magnesium. The cathode 230 may also be patterned by the barrier ribs 229.

Referring to FIG. 2E, the display unit A (see FIG. 2A or 2C) may comprise a thin film transistor T configured to drive an organic light emitting diode comprising the anode 220, the emission layer 227 and the cathode 230. The thin film transistor T comprises a semiconductive layer 211 disposed on the first substrate 210, a gate insulation layer 212, a gate electrode 213, an inter-insulation layer 214, and source and drain electrodes 215A and 215B. The anode 220 passes through a passivation layer 216 to be connected to the drain electrode 215B.

Referring back to FIGS. 2A to 2C, the display unit A have the structure described above may be connected to scan lines 217A and 217B and data lines 218. The scan lines 217A and 217B may be formed alternately on the left and right sides. A first pad unit 280A may be disposed in an end of the scan lines 217A and 217B and the data lines 218. A first sealant 270A is coated on a region of the first substrate 210 in an outer region of the display unit A.

A second substrate 260 is disposed to correspond to the first substrate 210. A moisture absorbent 265 is disposed on one surface of the second substrate 260. A second sealant 270B is coated on a region of the second substrate 260 corresponding to the first substrate 210 on which the first sealant 270A is coated.

A film 290 is disposed between the first substrate 210 and the second substrate 260. The film 290 comprises an opening 285 in a region corresponding to the display unit A, and is sealed with the first and second substrates 210 and 260 by the respective first and second sealants 270A and 270B. Therefore, the film 290 can be disposed outside the display unit A. The width of the film 290 may be larger than that of the display unit A and smaller than that of the first substrate 210 or the second substrate 260.

One side of the film 290 may extend to the outside of the first or second substrate 210 or 260. A driver 295 may be disposed on the extended portion of the film 290.

A second pad unit 280B may be disposed on a region of the film 290 corresponding to the first pad unit 280A. The second pad unit 280B may be electrically connected to the driver 295. When the first substrate 210 is sealed with the second substrate 260, the first and second pad units 280A and 280B may be in contact with each other through an anisotropic conductive film (ACF) 250. Due to this structural configuration, the second pad unit 280B can supply a driving signal provided from the driver 295 to the first pad unit 280A.

The organic light emitting display device according to the first embodiment of the present invention comprises the film 290 formed between the first substrate 210 and the second substrate 260 and on which the driver 295 is mounted. Therefore, the film 290 allows securing a certain distance between the first substrate 210 and the second substrate 260 and implementing a chip-on-film (COF) enabling the mounting of the driver 295 on the film 290.

<Second Embodiment>

Figure 3A:
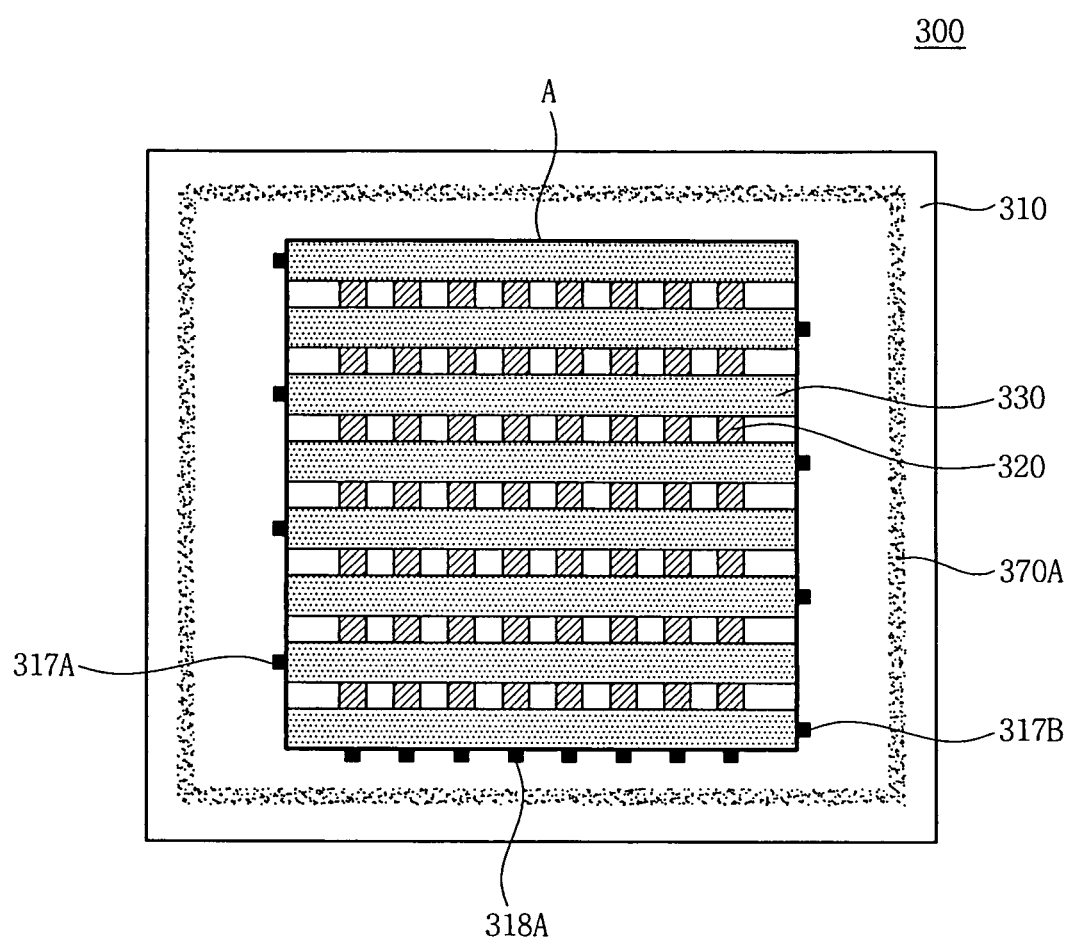
FIG. 3A illustrates a plan view of a first substrate of an organic light emitting display device according to a second embodiment of the present invention.
Figure 3B:
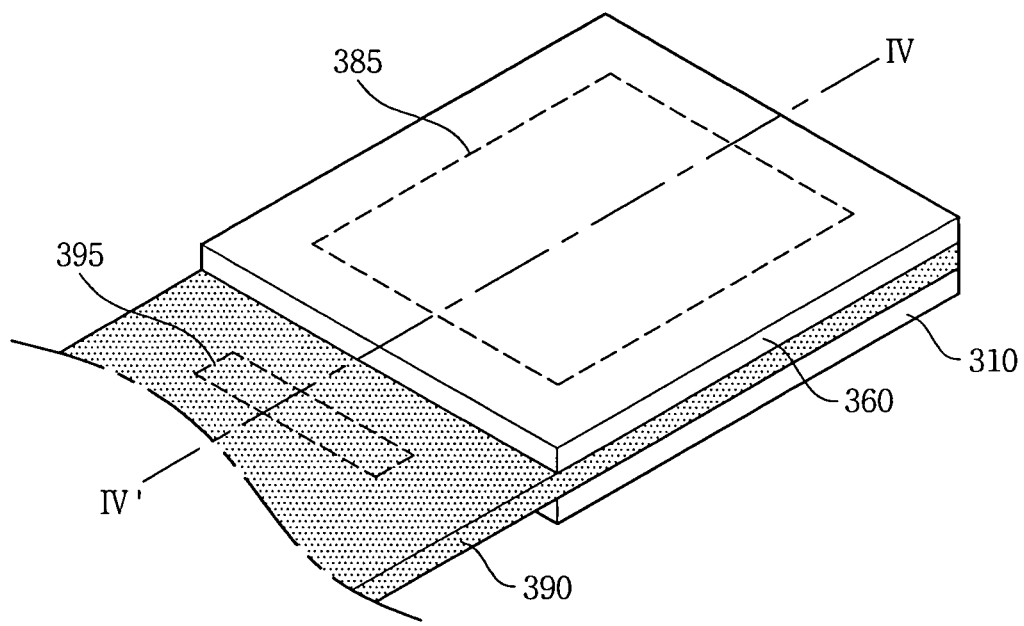
FIG. 3B illustrates a perspective view of the organic light emitting display device according to the second embodiment of the present invention.
Figure 3C:
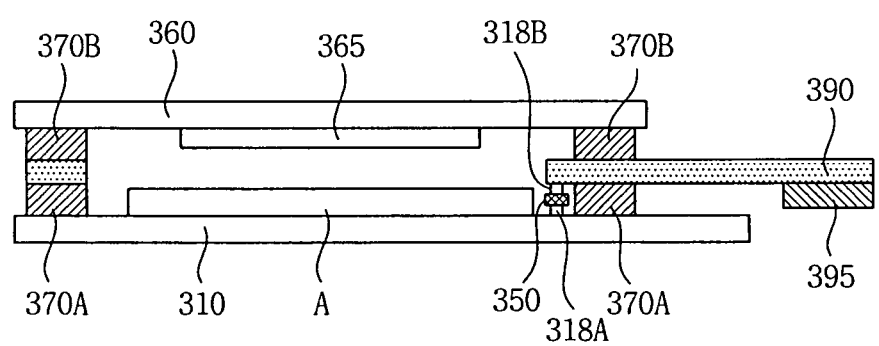
FIG. 3C illustrates a sectional view of the organic light emitting display device taken along a line IV-IV' illustrated in FIG. 3B.

FIG. 3A illustrates a plan view of a first substrate of an organic light emitting display device according to a second embodiment of the present invention. FIG. 3B illustrates a perspective view of the organic light emitting display device according to the second embodiment of the present invention. FIG. 3C illustrates a sectional view of the organic light emitting display device taken along a line IV-IV' illustrated in FIG. 3B.

Referring to FIGS. 3A to 3C, in the organic light emitting display device 300, a display unit A is disposed on a first substrate 310. The display unit A comprises anodes 320 arranged in a stripe pattern, and cathodes 330 disposed to intersect individually with the anodes 320. Although not illustrated, an emission layer is formed in every space between the anode 320 and the cathode 330.

The display unit A is connected to first scan pad units 317A and 317B, and second scan pad unit 318. In the second embodiment of the present invention, those lines configured to supply a driving signal from the outside to the display unit A are provided in the form of pads. The first scan pad units 317A and 317B may be formed alternately on the left and right sides. A first sealant 370A is coated on a region of the first substrate 310 in an end of the display unit A.

A second substrate 360 is disposed to correspondingly oppose the first substrate 310. A moisture absorbent 365 is disposed on one surface of the second substrate 360, and a second sealant 370B is coated on a region of the second substrate 360 corresponding to the first sealant 370A.

A film 390 is disposed between the first substrate 310 and the second substrate 360. The film 390 comprises an opening 385 in a region corresponding to the display unit A, and is sealed with the first and second substrates 310 and 360 by the respective first and second sealants 370A and 370B. Therefore, the film 390 can be disposed outside the display unit A. The width of the film 390 may be larger than that of the display unit A, and equal to or smaller than that of the first substrate 310 or the second substrate 360.

The film 390 may extend to the outside of the first or second substrate 310 or 360 on one side of the film 390. A driver 395 may be disposed in the region to which the film 390 extends.

A second scan pad unit (not shown) and a second data pad unit 380B may be disposed on regions of the film 390 corresponding to the first scan pad units 317A and 317B, and the first data pad unit 318A, respectively. The second scan pad unit (not shown) and the second data pad unit 380B may be electrically connected to the driver 395. When the first substrate 310 is sealed with the second substrate 360, the first scan pad units 317A and 317B, and the first data pad unit 318A may be in contact with the second scan pad unit (not shown) and the second data pad unit 380B through an ACF 350, respectively. As a result, the second scan pad unit (not shown) and the second data pad unit 380B can supply a driving signal provided from the driver 395 to the first scan pad units 317A and 317B, and the first data pad unit 318A, respectively.

The organic light emitting display device according to the second embodiment of the present invention comprises the film 390 formed between the first substrate 310 and the second substrate 360 and on which the driver 395 is mounted. Therefore, the film 390 allows securing a certain distance between the first substrate 310 and the second substrate 360 and implementing a COF enabling the mounting of the driver 395 on the film 390.

Also, in the organic light emitting display device according to the second embodiment of the present invention, since the lines are provided in the form of pads, a space for forming the lines can be reduced, and thus, lightweight organic light emitting display devices can be implemented.

<Third Embodiment>

Figure 4A:
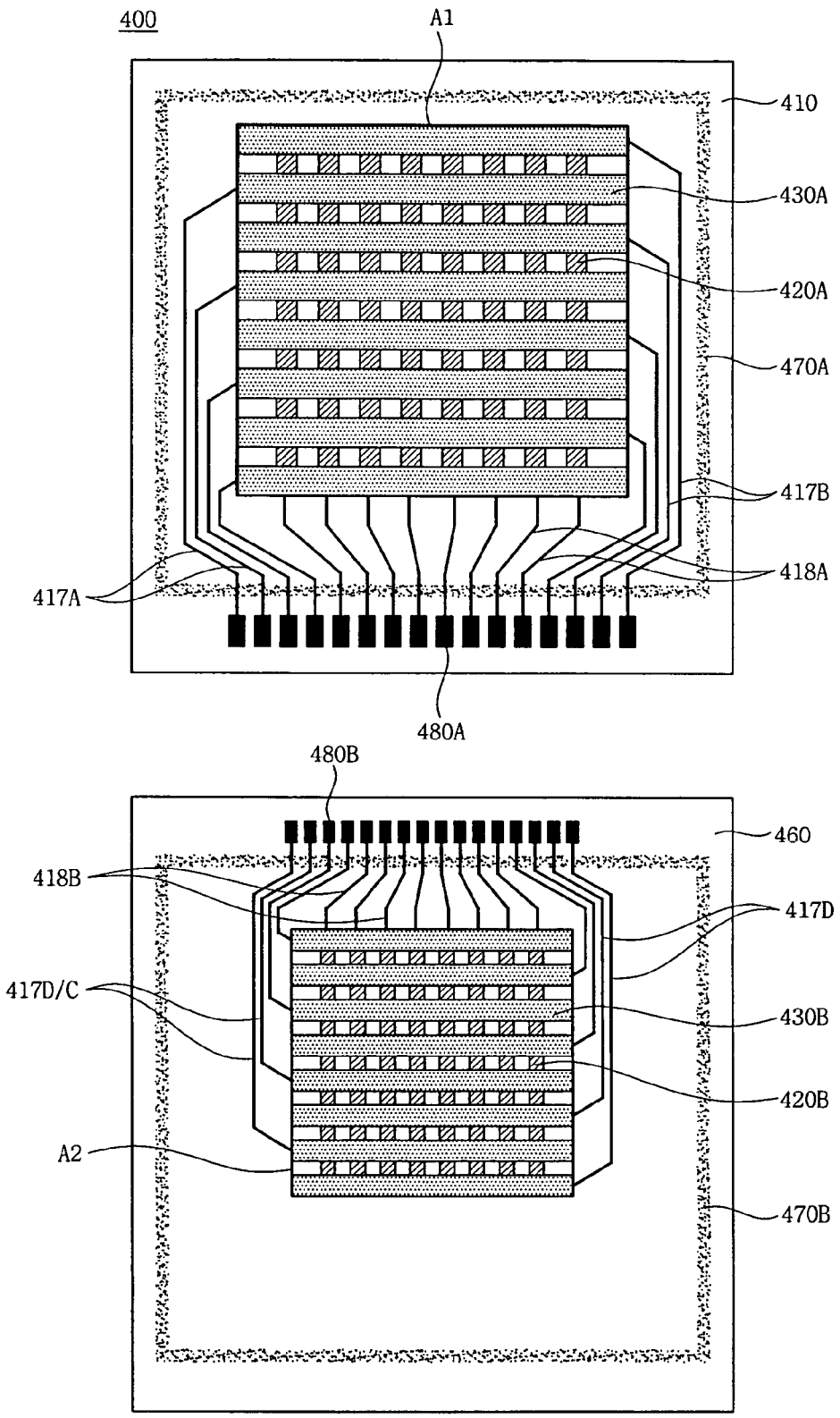
FIG. 4A illustrates a plan view of a first substrate of an organic light emitting display device according to a third embodiment of the present invention.
Figure 4B:
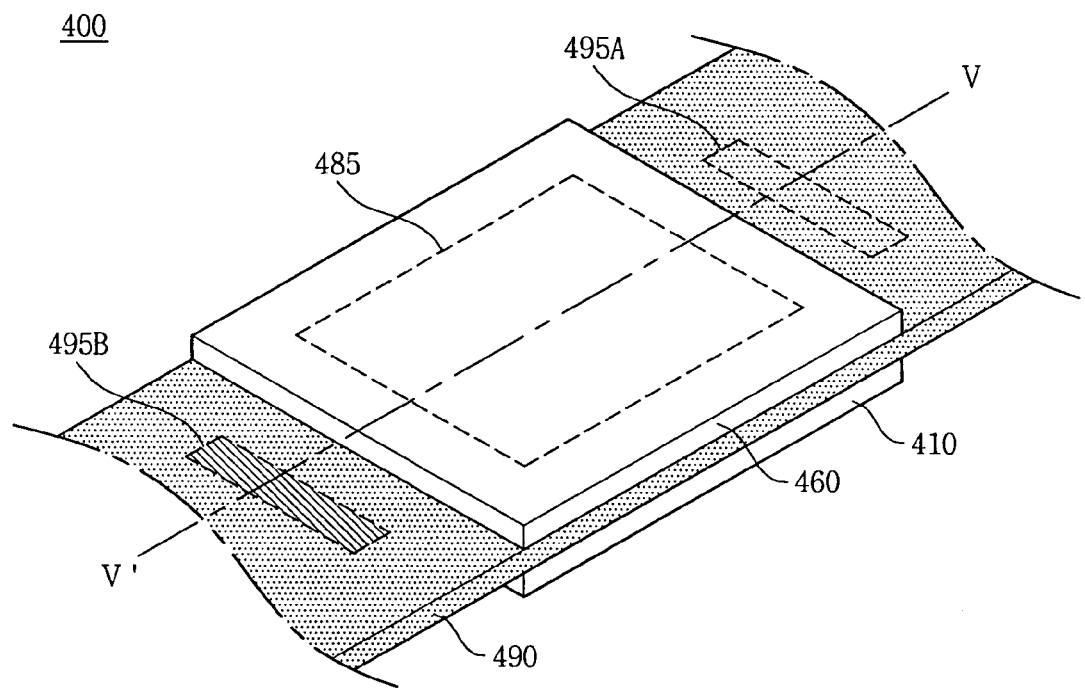
FIG. 4B illustrates a perspective view of the organic light emitting display device according to the third embodiment of the present invention.
Figure 4C:
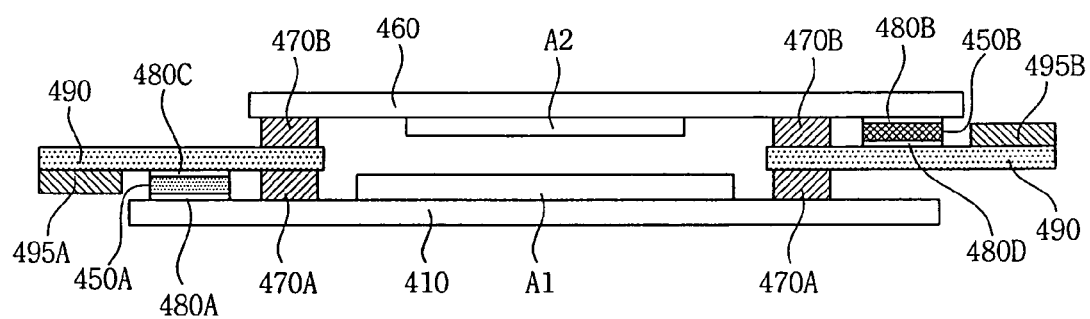
FIG. 4C illustrates a sectional view of the organic light emitting display device taken along a line V-V' illustrated in FIG. 4B.

Referring to FIGS. 4A to 4C, in an organic light emitting display device 400, a first display unit A1 is disposed on a first substrate 410. The first display unit A1 comprises first anodes 420A arranged in a stripe pattern, and second cathodes 430A formed to intersect individually with the first anodes 420A. Although not illustrated, a first emission layer is formed in every space between the first anode 420A and the first cathode 430A.

The first display unit A1 having the above described structure is connected to first scan lines 417A and 417B, and first data lines 418A. The first scan lines 417A and 417B may be formed alternately on the left and right sides, and a first pad unit 480A may be disposed in an end of the first scan lines 417A and 417B, and the first data lines 418A. A first sealant 470A is coated on a certain region of the first substrate 410 in an end of the display unit A.

A second substrate 460 is disposed to correspondingly oppose the first substrate 410. A second display unit A2 is disposed on the second substrate 460. Particularly, the second display unit A2 may be formed on a certain region of the second substrate 460 corresponding to the first display unit A1. The second display unit A2 comprises second anodes 420B arranged in a stripe pattern, and second cathodes 430B formed to intersect individually with the second anodes 420B. Although not illustrated, a second emission layer is disposed in every space between the second anode 420B and the second cathode 430B. The second display unit A2 may be smaller than the first display unit A1.

The second display unit A2 is connected to second scan lines 417C and 417D, and second data lines 418B. The second scan lines 417C and 417D may be formed alternately on the left and right sides, and a second pad unit 480B may be disposed in an end of the second scan lines 417C and 417D, and the second data lines 418B. A second sealant 470B is disposed on a region of the second substrate 460 corresponding to the first sealant 470A.

A film 490 is disposed between the first substrate 410 and the second substrate 460. The film 490 comprises an opening 485 in a region corresponding to the first display unit A1, and is sealed with the first and second substrates 410 and 460 by the respective first and second sealants 470A and 470B. Therefore, the film 490 can be disposed in an outer region of the first display unit A1. The width of the film 490 is larger than that of the first display unit A1, and equal to or smaller than the first or second substrate 410 or 460.

Both sides of the film 490 may extend to the outside of the first or second substrate 410 or 460. A first driver 495A is disposed on one surface of the extended regions of the film 490, and a second driver 495B is disposed on the other surface of the extended regions of the film 490.

A third pad unit 480C may be disposed on a region of the film 490 corresponding to the first pad unit 480A, and a fourth pad unit 480D may be disposed on a region of the film 490 corresponding to the second pad unit 480B. The third and fourth pad units 480C and 480D may be electrically connected to the respective first and second drivers 495A and 495B. When the first substrate 410 and the second substrate 460 are sealed together, the first and second pad units 480A and 480B may be in contact with the third and fourth pad units 480C and 480D through first and second ACFs 450A and 450B, respectively. As a result, the third and fourth pad units 480C and 480D can supply driving signals provided from the first and second drivers 495A and 495B to the first and second pad units 480A and 480B, respectively.

As described above, the organic light emitting display device according to the third embodiment of the present invention comprises the first and second substrates 410 and 460 on which the respective first and second display units A1 and A2 are formed, and the film 490 disposed between the first substrate 410 and the second substrate 460 and on which the first and second drivers 495A and 495B are formed. Therefore, due to the film 490, the first substrate 410 and the second substrate 460 can maintain a certain distance therebetween, and a COF, which allows the first and second drivers 495A and 495B to be mounted on the film 490, can be implemented.

Also, the organic light emitting display device according to the third embodiment of the present invention is a double-sided emission organic light emitting display device. Thus, the film is interposed between the two substrates where the two display units are individually formed and sealed with the two substrates. Accordingly, as compared with the conventional organic light emitting display apparatus, since no encapsulation substrate is used, the embodied organic light emitting display device can be lightweight.

Although the present invention has been described with reference to certain exemplary embodiments, it will be understood by those skilled in the art that a variety of modifications and variations may be made to the present invention without departing from the spirit or scope of the present invention defined in the appended claims, and their equivalents.

What is claimed is:

1. An organic light emitting display apparatus, comprising:
   a first substrate having a display unit;
   a second substrate facing with the display unit of the first substrate; and
   a film disposed between the first substrate and the second substrate and comprising an opening in a region corresponding to the display unit,
   wherein the film is configured to surround the display unit and be sealed with the first substrate and the second substrate by a first sealant and a second sealant, respectively, and
   wherein the film is extended to an outer region of the first or second substrate for being configured to install a driver disposed on the outer region of the film.

2. The organic light emitting display device of claim 1, wherein the first substrate comprises a first sealant formed in an outer region of the display unit; the second substrate comprises a second sealant formed in a region corresponding to the first sealant; and the film is sealed with the first and second substrates by the respective first and second sealants.

3. The organic light emitting display device of claim 1, further comprising:
   a first pad unit supplying an electrical signal to the display unit and disposed on the first substrate; and
   a second pad unit electrically connected to the driver on the film and disposed on a certain region of the film corresponding to the first pad unit to be electrically connected to the first pad unit.

4. The organic light emitting display device of claim 3, wherein the first pad unit is formed on one end of lines configured to supply an electrical signal to the display unit.

5. The organic light emitting display device of claim 3, wherein the first pad unit and the second pad unit are in contact with each other through an ACF (anisotropic conductive film).

6. The organic light emitting display device of claim 1, wherein the display unit comprises a plurality of sub-pixels, including:
   a first electrode and a second electrode; and
   an organic emission layer disposed between the first electrode and the second electrode.

7. The organic light emitting display device of claim 1, further comprising a moisture absorbent formed on the second substrate.

8. An organic light emitting display device comprising:
   a first substrate having a first display unit;
   a second substrate having a second display unit facing with the first display unit of the first substrate; and
   a film disposed between the first substrate and the second substrate and comprising an opening disposed in a region corresponding to the first and second display units,
   wherein the film is configured to surround the first and the second display units and be sealed with the first substrate and the second substrate by a first sealant and a second sealant, respectively, and
   wherein the film is extended to two sides of an outer region of the first or second substrate for being configured to install a first driver and a second driver disposed on each of the outer regions of the film.

9. The organic light emitting display device of claim 8, wherein the first substrate comprises a first sealant formed in an outer region of the first display unit; the second substrate comprises a second sealant formed in a region corresponding the first sealant; and the film is sealed with the first and second substrates by the respective first and second sealants.

10. The organic light emitting display device of claim 8, further comprising:
    a first pad unit and a second pad unit disposed on the respective first and second substrates and supplying an electrical signal to the first and second display units;
    a third pad unit electrically connected to the first driver on the film and formed on a certain region of the film corresponding to the first pad unit to be electrically connected to the first pad unit; and
    a fourth pad unit electrically connected to the second driver on the film and formed on a certain region of the film corresponding to the second pad unit to be electrically connected to the second pad unit.

11. The organic light emitting display device of claim 10, wherein the first driver and the third pad unit are disposed on one surface of the film; and the second driver and the fourth pad unit are disposed on the other surface of the film.

12. The organic light emitting display device of claim 10, wherein the first pad unit is in contact with the third pad unit through a first ACF (anisotropic conductive film); and the second pad unit is in contact with the fourth pad unit through a second ACF.

13. The organic light emitting display device of claim 10, wherein the first and second pad units are formed respectively in ends of lines configured to supply an electrical signal to the respective first and second display units.

14. The organic light emitting display device of claim 8, wherein the first and second display units each further comprises:
    a first electrode and a second electrode; and
    an organic emission layer interposed between the first electrode and the second electrode.

15. The organic light emitting display device of claim 8, wherein the first display unit and the second display unit have different sizes from each other.

* * * * *